United States Patent
Marr et al.

(10) Patent No.: US 10,707,913 B2
(45) Date of Patent: Jul. 7, 2020

(54) COMPOSABLE TRANSCEIVER USING LOW BIT COUNT INPUTS AND OUTPUTS

(71) Applicant: RAYTHEON COMPANY, Waltham, MA (US)

(72) Inventors: Harry B. Marr, Manhattan Beach, CA (US); Daniel Thompson, Hermosa Beach, CA (US); Ian S. Robinson, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/121,510

(22) Filed: Sep. 4, 2018

(65) Prior Publication Data

US 2020/0076464 A1 Mar. 5, 2020

(51) Int. Cl.
| | |
|---|---|
| H04B 1/40 | (2015.01) |
| H03K 3/84 | (2006.01) |
| H04B 1/04 | (2006.01) |
| H04B 1/10 | (2006.01) |
| H04L 25/02 | (2006.01) |
| H03M 1/00 | (2006.01) |

(52) U.S. Cl.
CPC ............. *H04B 1/40* (2013.01); *H03K 3/84* (2013.01); *H03M 1/002* (2013.01); *H04B 1/0475* (2013.01); *H04B 1/10* (2013.01); *H04L 25/0212* (2013.01)

(58) Field of Classification Search
CPC .......... H04B 1/40; H04B 1/0475; H04B 1/10; H04L 25/0212; H03K 3/84; H03M 1/002

USPC ................... 375/141, 285; 341/120
See application file for complete search history.

(56) References Cited

U.S. PATENT DOCUMENTS

| | | | |
|---|---|---|---|
| 4,044,306 A | 8/1977 | Villeret et al. | |
| 6,075,812 A * | 6/2000 | Cafarella | H04B 1/707 375/141 |
| 6,386,032 B1 | 5/2002 | Lemkin et al. | |
| 6,522,176 B1 * | 2/2003 | Davis | G06F 1/0335 327/105 |
| 6,737,418 B2 * | 5/2004 | Hogenkamp | C07D 207/416 514/183 |
| 7,015,851 B1 | 3/2006 | Bruhns et al. | |
| 9,094,081 B1 * | 7/2015 | Steinbrecher | H04B 1/0014 |

(Continued)

OTHER PUBLICATIONS

Klemmer, N. et al., "A 45nm CMOS RF-to-Bits LTE/WCDMA FDD/TDD 2x2 MIMO Base-Station Transceiver SoC with 200MHz RF Bandwidth", Feb. 2, 2016, IEEE International Solid-State Circuits Conference, pp. 164-166, IEEE.

(Continued)

*Primary Examiner* — Fitwi Y Hailegiorgis
(74) *Attorney, Agent, or Firm* — Lewis Roca Rothgerber Christie LLP

(57) ABSTRACT

A radio frequency system. In some embodiments, the system includes a one-bit receiver, and the one-bit receiver includes a digital pseudo random noise generator, a one-bit digital to analog converter, a power combiner, a one-bit analog to digital converter, and a digital subtraction circuit. The digital pseudo random noise generator produces a signal added to the received signal before analog to digital conversion. After analog to digital conversion, a delayed version of the dither is subtracted from the digital signal.

18 Claims, 5 Drawing Sheets

(56) References Cited

U.S. PATENT DOCUMENTS

| | | | |
|---|---|---|---|
| 2005/0285584 A1* | 12/2005 | Kwan | H02M 3/157 323/283 |
| 2016/0182075 A1* | 6/2016 | Devarajan | H03M 1/1019 341/120 |
| 2017/0041013 A1 | 2/2017 | Nagarajan et al. | |

OTHER PUBLICATIONS

Website: "USRP Software Defined Radio Device", National Instruments, http://www.ni.com/en-us/shop/select/usrp-software-defined-radio-device, printed Sep. 4, 2018, 2 pages.

"Zynq UltraScale+ RFSoC Data Sheet: Overview", Xilinx All Programmable, Advance Product Specification DS889, Jul. 23, 2018, pp. 1-33, Xilinx, Inc.

Wagdy, "Simulation Results on A/D Converter Dithering", Instrumentation and Measurement Technology Conference, 1998, IMTC/98. Conference Proceedings. IEEE, US, vol. 1, May 18, 1998 (pp. 78-83).

Invitation to Pay Additional Fees and, Where Applicable, Protest Fee in corresponding International Patent Application No. PCT/US2019/044554, Invitation dated Oct. 4, 2019 (15 pgs.).

International Search Report for corresponding International Application No. PCT/US2019/044554, filed Jul. 31, 2019, International Search Report dated Dec. 18, 2019 and dated Jan. 7, 2020 (7 pgs.).

Written Opinion of the International Searching Authority for corresponding International Application No. PCT/US2019/044554, filed Jul. 31, 2019, Written Opinion of the International Searching Authority dated Jan. 7, 2020 (16 pgs.).

\* cited by examiner

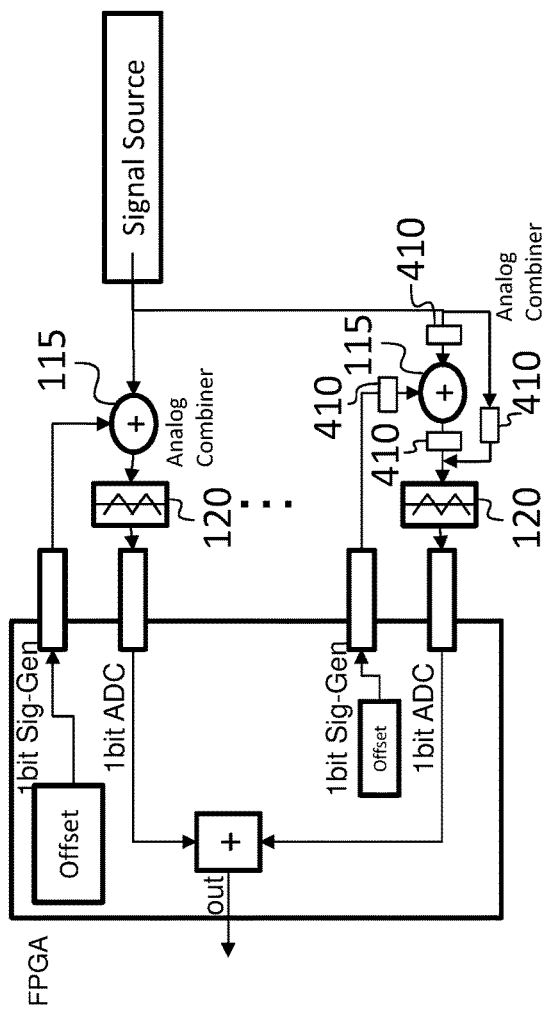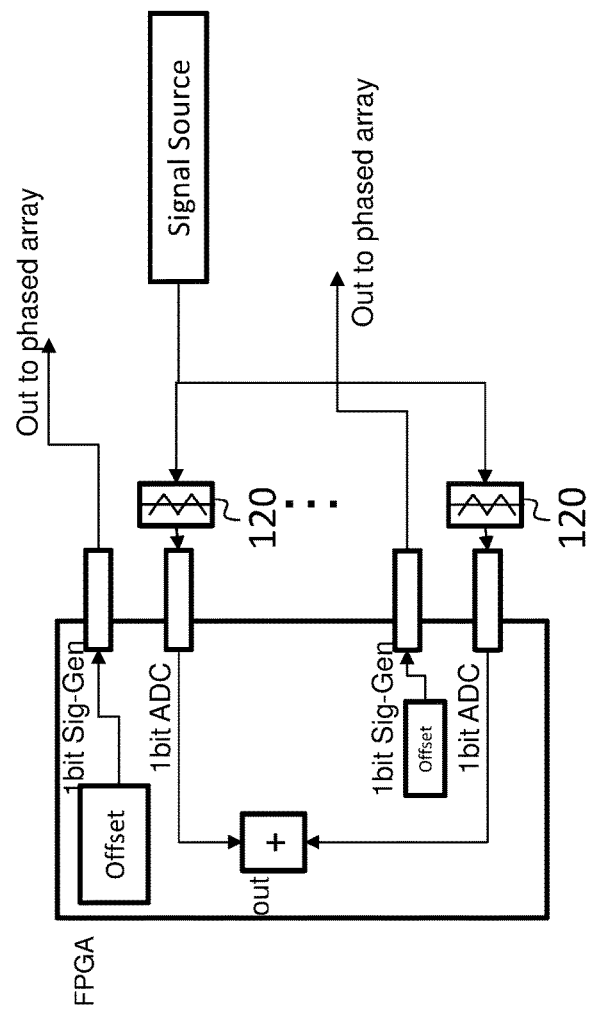
FIG. 4A
FIG. 4B

COMPOSABLE TRANSCEIVER USING LOW BIT COUNT INPUTS AND OUTPUTS

FIELD

One or more aspects of embodiments according to the present invention relate to radio frequency systems, and more particularly to a transceiver with single-bit input and output.

BACKGROUND

Radio frequency transmitters and receivers may include digital signal processing elements for performing various functions, as well as analog radio frequency components. The analog radio frequency components may significantly increase the cost, mass, and power consumption of a radio frequency transmitter or receiver.

Thus, there is a need for a radio frequency transceiver having a simple, low-cost analog radio frequency portion.

SUMMARY

According to an embodiment of the present invention, there is provided a radio frequency system, including: a one-bit receiver, having a radio frequency input and a digital output, and including: a digital pseudo random noise generator; a one-bit digital to analog converter, having an input connected to an output of the digital pseudo random noise generator; a power combiner, having a first input connected to an output of the one-bit digital to analog converter and a second input connected to the radio frequency input; a one-bit analog to digital converter, having an input operatively coupled to an output of the power combiner; and a digital subtraction circuit, having a first input connected to an output of the one-bit analog to digital converter, a second input operatively coupled to the output of the digital pseudo random noise generator, and an output connected to the digital output of the one-bit receiver.

In some embodiments, the radio frequency system further includes an attenuator connected between the output of the power combiner and the input of the one-bit analog to digital converter.

In some embodiments: the digital pseudo random noise generator, the one-bit digital to analog converter, the one-bit analog to digital converter, and the digital subtraction circuit are implemented in a field programmable gate array.

In some embodiments: the one-bit digital to analog converter is a serial transmitter.

In some embodiments: the one-bit analog to digital converter is a serial receiver.

In some embodiments, the digital pseudo random noise generator includes a linear feedback shift register.

In some embodiments, the radio frequency system further includes a digital filter having an input connected to the digital output of the one-bit receiver.

In some embodiments, the digital filter is an infinite impulse response filter.

In some embodiments, the digital filter is an integrator.

In some embodiments, the radio frequency system further includes: a one-bit transmitter having a digital input and an analog output, and including a digital pseudo random noise generator, a first digital adding circuit, a digital integrator, a second digital adding circuit, a digital comparator, a one-bit digital to analog converter, and a digital gain circuit, wherein the digital pseudo random noise generator of the one-bit transmitter has an output; the first digital adding circuit has: a first input, connected to the output of the digital pseudo random noise generator of the one-bit transmitter, a second input, and an output, the digital integrator has: an input connected to the output of the first digital adding circuit, and an output; the second digital adding circuit has: a first input, connected to the output of the digital integrator, a second input, connected to the digital input of the one-bit transmitter, and an output, the digital comparator has: a first input, connected to the output of the second digital adding circuit, a second input, connected to a digital constant, and an output, the one-bit digital to analog converter of the one-bit transmitter has: an input, connected to the output of the digital comparator, and an output, connected to the analog output of the one-bit transmitter; and the digital gain circuit has: an input, connected to the output of the digital comparator, an output, connected to the second input of the first digital adding circuit, and a low-frequency gain exceeding one.

In some embodiments, the digital constant is zero.

In some embodiments: the digital pseudo random noise generator of the one-bit transmitter, the first digital adding circuit, the digital integrator, the second digital adding circuit, the digital comparator, the one-bit digital to analog converter of the one-bit transmitter, and the digital gain circuit, are implemented in a field programmable gate array.

In some embodiments: the one-bit digital to analog converter of the one-bit transmitter is a serial transmitter.

In some embodiments, the digital pseudo random noise generator includes a linear feedback shift register.

In some embodiments, the digital gain circuit is an infinite impulse response filter.

In some embodiments, the digital gain circuit is configured to perform multiplication by a constant.

In some embodiments, the digital gain circuit is a left-shift circuit.

In some embodiments, the one-bit digital to analog converter of the one-bit receiver is a serial transmitter.

In some embodiments: the one-bit digital to analog converter of the one-bit receiver is a serial transmitter, the one-bit analog to digital converter of the one-bit receiver is a serial receiver, and the one-bit digital to analog converter of the one-bit transmitter is a serial transmitter.

In some embodiments: the first input of the power combiner is connected to the output of the one-bit digital to analog converter through a first switch, the second input of the power combiner is connected to the radio frequency input of the one-bit receiver through a second switch, the output of the power combiner is connected to the input of the one-bit analog to digital converter through a third switch and an attenuator, and the second input of the power combiner is connected to the output of the power combiner through a fourth switch.

BRIEF DESCRIPTION OF THE DRAWINGS

Features, aspects, and embodiments are described in conjunction with the attached drawings, in which:

FIG. 4A is a block diagram of a system employing an array transceiver, according to an embodiment of the present invention; and FIG. 4B is a block diagram of a system employing an array transceiver, according to an embodiment of the present invention.

DETAILED DESCRIPTION

The detailed description set forth below in connection with the appended drawings is intended as a description of exemplary embodiments of a transceiver with single-bit input and output provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
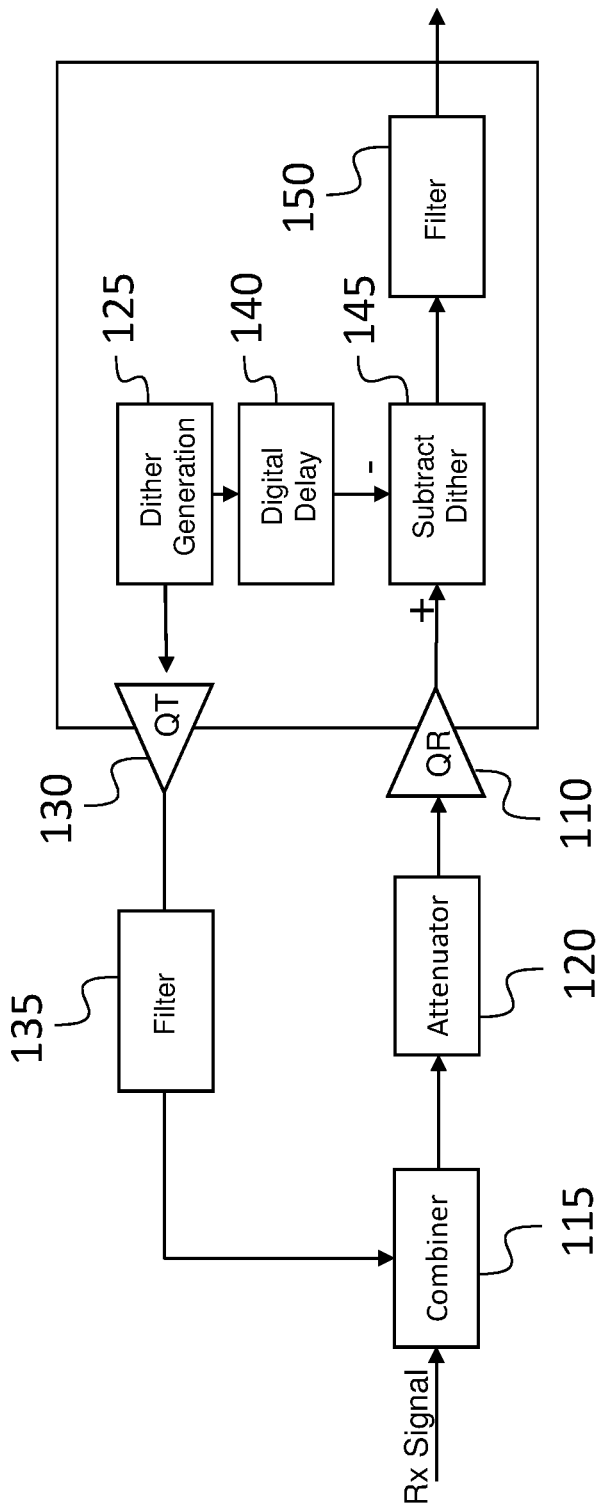
FIG. 1 is a block diagram of a receiver, according to an embodiment of the present invention.

Readily available field programmable gate arrays (FPGAs) may include serializer-deserializer (SERDES) inputs and outputs suitable for transmitting and receiving high speed serial data, with serial data rates of 30 gigabits per second (Gbps) or higher. In some embodiments, such inputs and outputs are used as high-speed one-bit (or single-bit) analog to digital converters, and one-bit digital to analog converters, respectively. Referring to FIG. 1, for example, in some embodiments, a received signal ("Rx Signal") (e.g., from a radio frequency antenna, or from an antenna element of an array antenna) propagates to a serial receiver configured to operate as a one-bit analog to digital converter 110 (which may be part of a SERDES channel of an FPGA). The signal path may pass through a combiner 115 (which may have two inputs, and an output; the signal may be fed into one of the inputs of the combiner 115 and out of the output of the combiner 115), as discussed in further detail below, and through an attenuator 120. The attenuator 120 may be selected to result in a signal amplitude, at the input of the one-bit analog to digital converter 110, suitable for the one-bit analog to digital converter 110. The one-bit analog to digital converter 110 converts the received analog signal to a one bit wide digital signal, which is then processed by dither subtraction, and optionally by other processing, as discussed in further detail below.

A dither may be applied to the received analog signal and subsequently removed from the digital signal, to improve the effective resolution of the receiver. For example, a dither generator 125, such as a digital pseudo random noise generator (e.g., a linear feedback shift register), may be used to generate a digital dither, which may be converted to an analog dither by a one-bit digital to analog converter 130, and the analog dither may be fed into another input of the combiner 115. In some embodiments the one-bit digital to analog converter 130 supplying the analog dither is connected to the combiner 115 through an analog filter 135 (e.g., a low-pass filter); in other embodiments the one-bit digital to analog converter 130 is connected directly to the combiner 115. In the latter case natural bandwidth limits of the one-bit digital to analog converter 130, of the connection (e.g., of a radio frequency transmission line connecting the one-bit digital to analog converter 130 to the combiner 115), or of the combiner 115 may provide a filtering action even when no separate filtering component is present.

The effect of the dither may be to cause transitions, at the one-bit analog to digital converter 110, which would not have occurred absent the dither. For example, if the received signal has a constant value just above the transition threshold (from zero to one) of the one-bit analog to digital converter 110, then absent the dither the output of the one-bit analog to digital converter 110 would be a stream of ones. When the dither is present, however, it may on occasion change the analog signal at the input of the one-bit analog to digital converter 110 enough to cause a transition to zero, so that in the presence of the dither, the output of the one-bit analog to digital converter 110 may be a stream including both zeros and ones, in a proportion depending on the amount by which the value of the received signal exceeds the transition threshold.

In this manner, the amount of information about the received signal that is present in the stream of data at the output of the one-bit analog to digital converter 110 is increased by the presence of the dither. The dither may be subsequently subtracted from the stream of data at the output of the one-bit analog to digital converter 110, as discussed in further detail below, to reduce or remove any degradation of signal to noise ratio caused by the addition of the dither in the combiner 115.

In some embodiments, subtraction of the dither from the stream of data at the output of the one-bit analog to digital converter 110 is performed as follows. The output of the digital pseudo random noise generator 125 is fed (in addition to being fed to the one-bit digital to analog converter 130, as mentioned above) to a digital delay 140 (e.g., a shift register), and from there to a digital subtraction circuit 145 which performs the subtraction of the dither from the stream of data at the output of the one-bit analog to digital converter 110. The digital subtraction circuit 145 may be a circuit having two inputs each one bit wide, and an output that is two bits wide. In some embodiments, the output of the one-bit analog to digital converter 110 is processed by an FFT or filter (e.g., an IIR or FIR filter) to form a multi-bit data stream. Each of the digital delay 140, the digital subtraction circuit 145, and the digital filter 150 may be a high bit count circuit (e.g., a circuit having a 16 bit wide output). In some embodiments a filter is present before the digital subtraction circuit 145 instead of, or in addition to, the digital filter 150 that follows the digital subtraction circuit 145 in FIG. 1. All of the digital circuits of FIG. 1 may be implemented in one or more FPGAs.

The shift register may consist of a chain of flip flops, the number of flip flops in the chain being approximately proportional to the time delay along the analog signal path from the output of the one-bit digital to analog converter 130, through the analog filter 135, through the combiner 115, through the attenuator 120, and to the input of the one-bit analog to digital converter 110. For example, the number of flip flops in the chain may be approximately equal to the delay in the analog signal path divided by the period of the clock of the FPGA (or by the period of the clock of the clock domain, within the FPGA, containing the digital delay 140, if the FPGA includes more than one clock domain), or it may be this ratio plus one or plus two to account for conversion delays in the one-bit digital to analog converter 130 and in the one-bit analog to digital converter 110.

A digital filter 150 may be connected to the output of the digital subtraction circuit 145; this filter may have an input that is two bits wide and an output that is wider (e.g., 8 bits wide, 16 bits wide, or 32 bits wide). The digital filter 150 may be a finite impulse response filter or an infinite impulse response filter (e.g., an integrator). The digital filter 150 may be a band pass or low pass filter to filter just to a signal of interest. For example, if the signal of interest is a 20 MHz radar signal at a baseband, the digital filter 150 may be a 20 MHz low pass FIR filter. A sufficient number of taps to reject the out of band by 40-60 dB, depending on the application, may be used, so the digital filter 150 may have a number of taps accordingly, 16 taps to hundreds of taps, depending on sharpness. A receiver such as that illustrated in FIG. 1 and relying on a one-bit analog to digital converter may be referred to as a "one-bit receiver". The one-bit receiver may be defined to include, or to have an output connected to, the digital filter 150.

Figure 2:
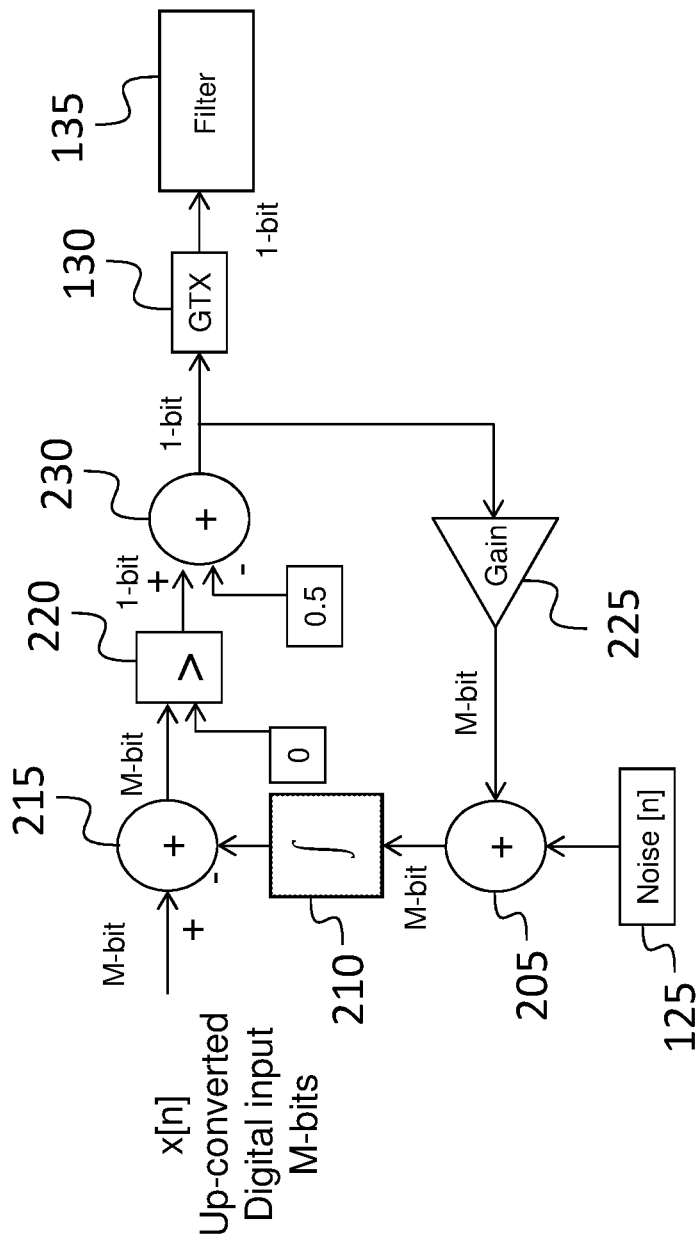
FIG. 2 is a block diagram of a transmitter, according to an embodiment of the present invention.

In some embodiments a one-bit transmitter may similarly be constructed using a one-bit digital to analog converter 130. Referring to FIG. 2, such a one-bit transmitter may include a digital pseudo random noise generator 125, a first digital adding circuit 205, a digital integrator 210, a second digital adding circuit 215, a digital comparator 220, a one-bit digital to analog converter 130, and a digital gain circuit 225. The output of the digital pseudo random noise generator 125 is connected to an input of the first digital adding circuit 205 (which has two inputs and an output), the output of the digital adding circuit 205 is connected to an input of the digital integrator 210, the output of the digital integrator 210 is connected to an input of the second digital adding circuit 215 (which also has two inputs and an output), the output of the second digital adding circuit 215 is connected to an input of the digital comparator 220 (which also has two inputs and an output), the output of the digital comparator 220 is connected to (i) the input of the one-bit digital to analog converter 130, and (ii) the input of the digital gain circuit 225. The output of the digital gain circuit 225 is connected to the other input of the first digital adding circuit 205, and the digital signal to be transmitted, at the digital input of the one-bit transmitter, may be connected to the other input of the second digital adding circuit 215. An analog filter 135 may be present at the output of the one-bit digital to analog converter 130. All of the digital circuits of FIG. 2 (e.g., all of the circuits except for the analog filter 135) may be implemented in one or more FPGAs.

The dummy adding block 230 of FIG. 2 is shown, in FIG. 2, to represent an offset between a value ranging between zero and one at the output of the comparator, and a value ranging over a symmetric range (e.g., −0.5 to 0.5) at the output of the transmitter (e.g., as a result of the circuitry of the SERDES channel, or as a result of capacitive coupling in an analog circuit (or an antenna or antenna element) connected to the one-bit digital to analog converter 130). As such, the dummy adding block 230 of FIG. 2 may not correspond to any particular circuit elements in the one-bit transmitter, or it may correspond to no circuit elements at all.

In operation, the digital signal to be transmitted, which may be wider than one bit wide (e.g., 8 bits wide, 16 bits wide, or 32 bits wide) has subtracted from it (by the second digital adding circuit 215) the output of the integrator 210, and the result is fed to one input of the digital comparator 220. If the difference is greater than a constant value at the other input of the digital comparator 220 (which may be zero, as shown) then the digital comparator 220 produces a value of one, which is sent to the one-bit digital to analog converter 130 (and, e.g., filtered and transmitted through an antenna). If the difference is less than the constant value then the digital comparator 220 produces a value of zero, which is similarly sent to the one-bit digital to analog converter 130.

The digital pseudo random noise generator 125 generates a digital dither signal, which is added, by the first digital adding circuit 205, to the signal at the output of the digital gain circuit 225. A sign change is shown in FIG. 2 at one input of the second digital adding circuit 215, but the sign change may, in other embodiments, occur elsewhere in the signal loop shown. The dither may serve the purpose of linearizing the ADC, because an ADC may very linearly digitize a signal that is "under the noise". A −10 dB or less signal to noise ratio may be employed to mitigate quantization and other spurs from the ADC. The digital gain circuit may be any suitable circuit having a low-frequency gain greater than 1, such as a digital filter (e.g., an infinite impulse response filter) having a low-frequency gain greater than 1, or a circuit multiplying by a constant greater than one (e.g., a circuit multiplying by a power of two, i.e., a left-shift circuit).

Figure 3A:
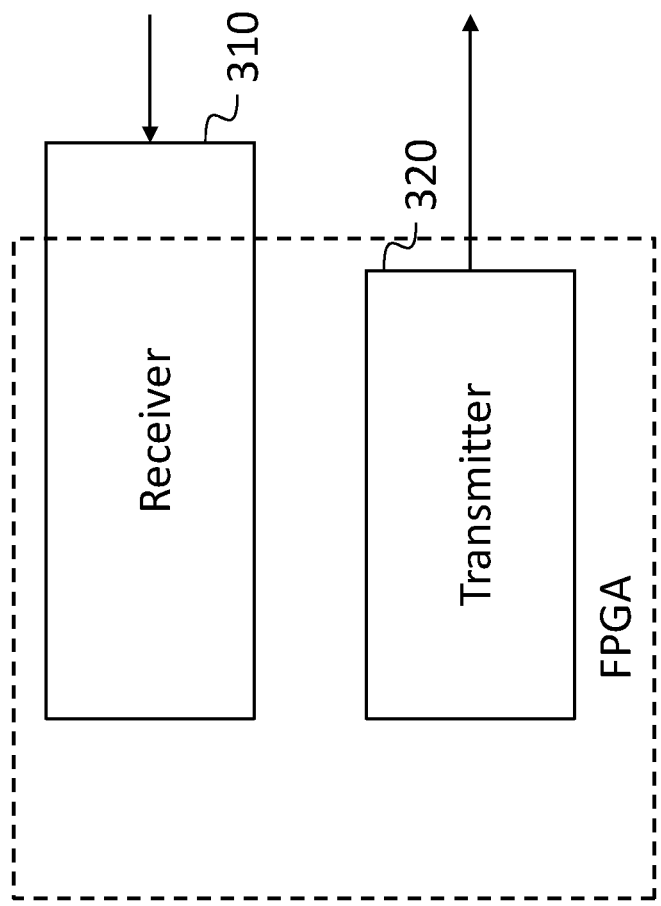
FIG. 3A is a block diagram of a transceiver, according to an embodiment of the present invention.

Referring to FIG. 3A, in some embodiments a one-bit receiver 310 and a one-bit transmitter 320 may be combined to form a transceiver, as shown. The digital portions of the one-bit receiver 310 and of the one-bit transmitter 320 may be implemented in one or more FPGAs (e.g., they may share an FPGA, as shown). In some embodiments the one-bit transmitter 320 may not include analog elements and may be implemented entirely within the FPGA (as shown); in other embodiments the one-bit transmitter 320 may include analog elements such as an analog filter 135 (as shown in FIG. 2).

Figure 3B:
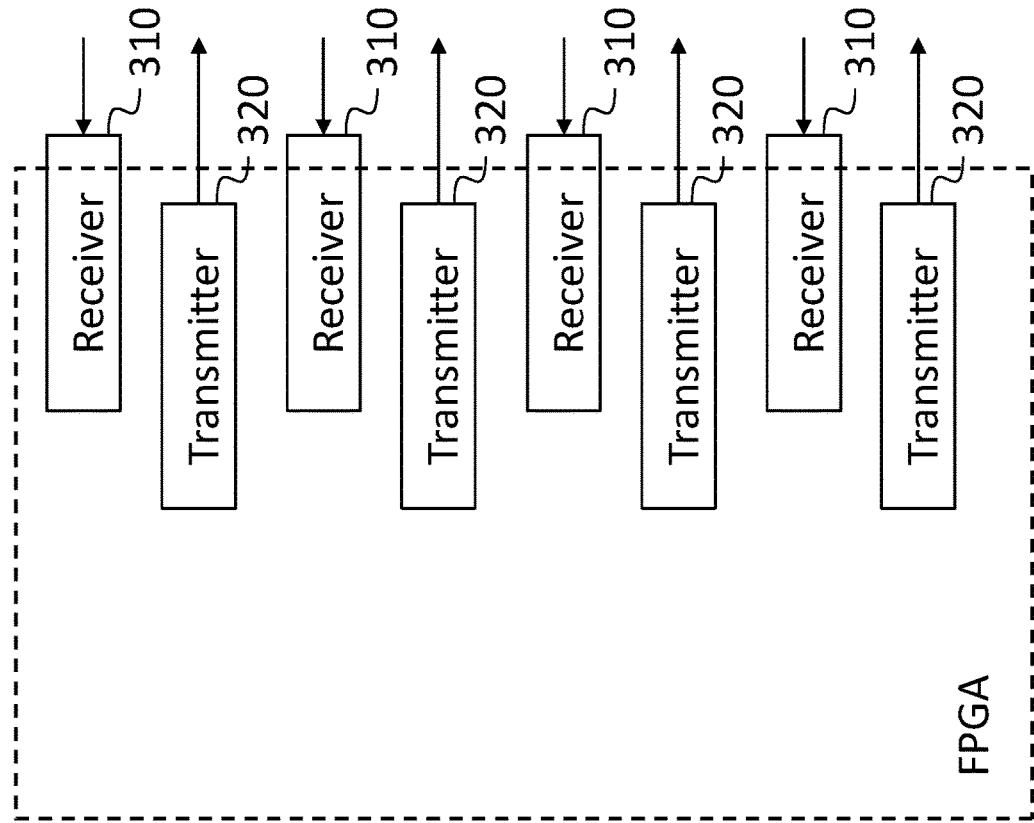
FIG. 3B is a block diagram of an array transceiver, according to an embodiment of the present invention.

Referring to FIG. 3B, in some embodiments an array of one-bit receivers 310 and an array of one-bit transmitters 320 may be combined and may share an FPGA, as shown. Such embodiments may be suitable, for example, for use with one or more array antennas, each one-bit receiver 310 being connected to an antenna element of an array antenna and each one-bit transmitter 320 being connected to an antenna element of an array antenna, or each pair being connected to a shared antenna element of an array antenna, each pair including a one-bit receiver 310 and a one-bit transmitter 320, and being connected to the shared antenna element by a radio frequency circulator, a radio frequency diplexer, or a radio frequency switch, for example.

Referring to FIGS. 4A and 4B, in some embodiments an FPGA internally configured (i.e., programmed) as discussed above may be externally connected to form several configurations having different applications. For example, in the configuration of FIG. 4A, each one of an array of serial outputs of an FPGA is connected to a power combiner 115, the output of which is connected, through an attenuator 120, to a serial input of the FPGA, forming an array of circuits similar to that of FIG. 1. Suitable RF switches may be employed to transition between the configuration of FIG. 4A and the configuration of FIG. 4B, in which the power combiners 115 are bypassed by the incoming signal and the signals from the serial outputs of the FPGA are routed to a phased array. For example (as shown for the last channel of FIG. 4A), in some embodiments, to achieve this functionality, a first input of the power combiner 115 is connected to a serial output of the FPGA through a first switch 410, the second input of the power combiner is connected to the signal source through a second switch 410, the output of the power combiner is connected to a serial input of the FPGA through a third switch 410 and through an attenuator 120, and the second input of the power combiner is connected to the output of the power combiner through a fourth switch 410. Each of the switches 410 may, for example, be a single pole single throw (SPST) switch, or it may be a single pole double throw (SPDT) switch, with one terminal connected to a suitable termination (or a cascade of two such switches), so that opening the switch does not result in an unacceptable degradation in return loss (at the switch, or elsewhere in the circuit).

In some embodiments, an FPGA having multi-level serial inputs and outputs (e.g., PAM-4 or PAM-8 inputs and outputs) may be employed to similar effect. Each such input or output may be used as a low-resolution analog to digital converter, or as a low-resolution digital to analog converter, respectively, and the effective resolution and linearity of the inputs and outputs may be enhanced using high-rate sampling (i.e., sampling well in excess of the Nyquist frequency), dither, and sigma delta methods, as described in further detail above.

Although limited embodiments of a transceiver with single-bit input and output have been specifically described and illustrated herein, many modifications and variations will be apparent to those skilled in the art. Accordingly, it is to be understood that a transceiver with single-bit input and output employed according to principles of this invention may be embodied other than as specifically described herein. The invention is also defined in the following claims, and equivalents thereof.

What is claimed is:

1. A radio frequency system, comprising:
   a one-bit receiver, having a radio frequency input and a digital output, and comprising:
   a digital pseudo random noise generator;
   a one-bit digital to analog converter, having an input connected to an output of the digital pseudo random noise generator;
   a power combiner, having a first input connected to an output of the one-bit digital to analog converter and a second input connected to the radio frequency input;
   a one-bit analog to digital converter, having an input operatively coupled to an output of the power combiner;
   a shift register, having an input connected to the digital pseudo random noise generator; and
   a digital subtraction circuit, having a first input connected to an output of the one-bit analog to digital converter, a second input operatively coupled to an output of the shift register, and an output connected to the digital output of the one-bit receiver,
   wherein:
   the digital pseudo random noise generator,
   the one-bit digital to analog converter,
   the one-bit analog to digital converter,
   the shift register, and
   the digital subtraction circuit
   are implemented in a field programmable gate array, and wherein:
   the one-bit analog to digital converter is a serial receiver.

2. The radio frequency system of claim 1, further comprising an attenuator connected between the output of the power combiner and the input of the one-bit analog to digital converter.

3. The radio frequency system of claim 1, wherein:
   the one-bit digital to analog converter is a serial transmitter.

4. The radio frequency system of claim 1, wherein the digital pseudo random noise generator comprises a linear feedback shift register.

5. The radio frequency system of claim 1, further comprising a digital filter having an input connected to the digital output of the one-bit receiver.

6. The radio frequency system of claim 5, wherein the digital filter is an infinite impulse response filter.

7. The radio frequency system of claim 6, wherein the digital filter is an integrator.

8. A radio frequency system, comprising:
   a one-bit receiver, having a radio frequency input and a digital output, and comprising:
   a digital pseudo random noise generator;
   a one-bit digital to analog converter, having an input connected to an output of the digital pseudo random noise generator;
   a power combiner, having a first input connected to an output of the one-bit digital to analog converter and a second input connected to the radio frequency input;
   a one-bit analog to digital converter, having an input operatively coupled to an output of the power combiner; and
   a digital subtraction circuit, having a first input connected to an output of the one-bit analog to digital converter, a second input operatively coupled to the output of the digital pseudo random noise generator, and an output connected to the digital output of the one-bit receiver,
   the radio frequency system further comprising:
   a one-bit transmitter having a digital input and an analog output, and comprising
   a digital pseudo random noise generator,
   a first digital adding circuit,
   a digital integrator,
   a second digital adding circuit,
   a digital comparator,
   a one-bit digital to analog converter, and
   a digital gain circuit,
   wherein
   the digital pseudo random noise generator of the one-bit transmitter has an output;
   the first digital adding circuit has:
   a first input, connected to the output of the digital pseudo random noise generator of the one-bit transmitter,
   a second input, and
   an output,
   the digital integrator has:
   an input connected to the output of the first digital adding circuit, and
   an output;
   the second digital adding circuit has:
   a first input, connected to the output of the digital integrator,
   a second input, connected to the digital input of the one-bit transmitter, and
   an output,
   the digital comparator has:
   a first input, connected to the output of the second digital adding circuit,
   a second input, connected to a digital constant, and
   an output,
   the one-bit digital to analog converter of the one-bit transmitter has:
   an input, connected to the output of the digital comparator, and
   an output, connected to the analog output of the one-bit transmitter; and
   the digital gain circuit has:
   an input, connected to the output of the digital comparator, an output, connected to the second input of the first digital adding circuit, and a low-frequency gain exceeding one.

9. The radio frequency system of claim 8, wherein the digital constant is zero.

10. The radio frequency system of claim 8, wherein:

the digital pseudo random noise generator of the one-bit transmitter, the first digital adding circuit, the digital integrator, the second digital adding circuit, the digital comparator, the one-bit digital to analog converter of the one-bit transmitter, and the digital gain circuit, are implemented in a field programmable gate array.

11. The radio frequency system of claim 10, wherein:

the one-bit digital to analog converter of the one-bit transmitter is a serial transmitter.

12. The radio frequency system of claim 8, wherein the digital pseudo random noise generator of the one-bit transmitter comprises a linear feedback shift register.

13. The radio frequency system of claim 8, wherein the digital gain circuit is an infinite impulse response filter.

14. The radio frequency system of claim 8, wherein the digital gain circuit is configured to perform multiplication by a constant.

15. The radio frequency system of claim 8, wherein the digital gain circuit is a left-shift circuit.

16. The radio frequency system of claim 8, wherein:

the one-bit digital to analog converter of the one-bit receiver is a serial transmitter.

17. The radio frequency system of claim 8, wherein:

the one-bit digital to analog converter of the one-bit receiver is a serial transmitter, the one-bit analog to digital converter of the one-bit receiver is a serial receiver, and the one-bit digital to analog converter of the one-bit transmitter is a serial transmitter.

18. A radio frequency system, comprising:

a one-bit receiver, having a radio frequency input and a digital output, and comprising:

a digital pseudo random noise generator;

a one-bit digital to analog converter, having an input connected to an output of the digital pseudo random noise generator;

a power combiner, having a first input connected to an output of the one-bit digital to analog converter and a second input connected to the radio frequency input;

a one-bit analog to digital converter, having an input operatively coupled to an output of the power combiner; and a digital subtraction circuit, having a first input connected to an output of the one-bit analog to digital converter, a second input operatively coupled to the output of the digital pseudo random noise generator, and an output connected to the digital output of the one-bit receiver, wherein:

the first input of the power combiner is connected to the output of the one-bit digital to analog converter through a first switch, the second input of the power combiner is connected to the radio frequency input of the one-bit receiver through a second switch, the output of the power combiner is connected to the input of the one-bit analog to digital converter through a third switch and an attenuator, and the second input of the power combiner is connected to the output of the power combiner through a fourth switch.

* * * * *